(12) United States Patent
Mori et al.

(10) Patent No.: US 8,330,193 B2
(45) Date of Patent: Dec. 11, 2012

(54) SILICON OXIDE FILM, PRODUCTION METHOD THEREFOR AND SEMICONDUCTOR DEVICE HAVING GATE INSULATION FILM USING THE SAME

(75) Inventors: Shigeru Mori, Kanagawa (JP); Hiroshi Tanabe, Kanagawa (JP); Jun Tanaka, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 526 days.

(21) Appl. No.: 12/131,249

(22) Filed: Jun. 2, 2008

(65) Prior Publication Data
US 2008/0296580 A1    Dec. 4, 2008

(30) Foreign Application Priority Data
Jun. 1, 2007 (JP) ................................ 2007-147405

(51) Int. Cl.
*H01L 29/76* (2006.01)
(52) U.S. Cl. ................. 257/288; 257/E21.639; 438/787
(58) Field of Classification Search .......... 438/780–790, 438/623, 635; 257/288, 410–411, E29.132, 257/E21.639
See application file for complete search history.

(56) References Cited

U.S. PATENT DOCUMENTS 7,538,348 B2 * 5/2009 Kato et al. ...................... 257/66
7,547,643 B2 * 6/2009 Schmitt et al. ................. 438/758
2005/0191846 A1 * 9/2005 Cheung et al. ................. 438/623

FOREIGN PATENT DOCUMENTS

| JP | 10-321619 | 12/1998 |
| JP | 2000-357690 | 12/2000 |
| JP | 2001-135822 | 5/2001 |
| JP | 2001-230419 | 8/2001 |
| JP | 2002-261285 | 9/2002 |

OTHER PUBLICATIONS

Japanese Office Action issued Dec. 20, 2011 by the Japanese Patent Office in counterpart Japanese application No. 2008-136491, with English translation of the portions enclosed in wavy lines, 4 pages.

* cited by examiner

*Primary Examiner* — Steven Loke
*Assistant Examiner* — Ali Naraghi
(74) *Attorney, Agent, or Firm* — Young & Thompson (57) ABSTRACT

The present invention provides a high-performance silicon oxide film as a gate insulation film and a semiconductor device having superior electric characteristics. The silicon oxide film according to the present invention includes $CO_2$ in the film, wherein, when an integrated intensity of a peak is expressed by (peak width at half height)×(peak height) in an infrared absorption spectrum, the integrated intensity of a $CO_2$-attributed peak which appears in the vicinity of a wave number of 2,340 cm$^{-1}$ is 8E-4 times or more with respect to the integrated intensity of an $SiO_2$-attributed peak which appears in the vicinity of a wave number of 1,060 cm$^{-1}$.

20 Claims, 10 Drawing Sheets

HEAT-TREAT

SILICON OXIDE FILM, PRODUCTION METHOD THEREFOR AND SEMICONDUCTOR DEVICE HAVING GATE INSULATION FILM USING THE SAME

BACKGROUND OF THE INVENTION

1. Field of the Invention

The present invention relates to a silicon oxide film, and particularly to a silicon oxide film having superior electric characteristics as a gate insulation film and a production method therefor. The present invention also relates to a semiconductor device, an active-matrix substrate and an electronic device, which are provided with the silicon oxide film as the gate insulation film.

2. Description of the Related Art

It is well-known to use a thin film transistor (TFT) formed on an insulative substrate such as a glass substrate as a driving device of an active-matrix type of a liquid-crystal display panel. In recent years, the TFT having high durability and high reliability is needed due to the tendency of imparting many functions to and microfabricating a semiconductor device containing the TFT. It is particularly important to suppress the variation of a threshold value ($V_{th}$) of the TFT, which occurs when voltage has been applied to a gate electrode for many hours. The variation of electric characteristics caused by an electric stress due to the voltage application on the TFT for many hours, that is to say, the reliability of the TFT is known to have a relationship with characteristics of the gate insulation film. In order to improve the reliability of the gate insulation film, for instance, there is such a technique as is described in Patent Document 1, which suppresses the variation of the $V_{th}$ of the TFT by inhibiting the gate insulation film from trapping an electric charge which has been injected into the gate insulation film when the voltage has been applied to a gate electrode, by blending carbon in the gate insulation film which is mainly formed of a silicon oxide film and reducing a charge trapping level.

There is water ($H_2O$) as another impurity which exerts an effect on electric characteristics of the gate insulation film. It is well known as is described in Patent Document 2 that when a large amount of $H_2O$ exists in the gate insulation film, for instance, the electric characteristics of the gate insulation film are deteriorated and the variation of the electric characteristics of the TFT with the use of such a gate insulation film increases due to the voltage application.

[Patent Document 1] Japanese Patent Laid-Open No. 2001-135822 (23rd lines in right column on page 2)
[Patent Document 2] Japanese Patent Laid-Open No. 10-321619 (35th lines in right column on page 2)

However, the TFT disclosed in Patent Document 1 has such problems as will be described below. The problem is that when the carbon in the gate insulation film exists in such a state of having high electroconductivity as that of graphite, an electric current may flow through the gate insulation film when the voltage is applied to the gate electrode, and rather deteriorate the gate isolation voltage. It is also known from an experiment by the present inventors that when an organosilane is used for forming the gate insulation film and many intermediate products containing carbon which has been produced due to an insufficient decomposition of the organosilane exist, the phenomenon becomes remarkable. For this reason, the method of simply making carbon exist in the gate insulation film did not show a sufficient effect of reducing the variation of electric characteristics of the TFT, which occurs when voltage is applied to the gate electrode of the TFT for many hours.

On the other hand, when the TFT is formed on a glass substrate, a high-temperature process (for instance, 1,000° C. or higher) cannot be applied, so that $H_2O$ which has been produced or has been taken from outside while the TFT is formed is not completely eliminated and remains in the TFT to some extent. For this reason, it has been difficult to reduce the variation of the electric characteristics of the TFT.

An object of the present invention is to provide a silicon oxide film which can be a high-performance gate insulation film, by solving the above described problems.

SUMMARY OF THE INVENTION

Then, the present inventors made an extensive investigation, and found that it was possible to make a silicon oxide film contain $CO_2$ by forming the silicon oxide film on a predetermined condition and that the silicon oxide film containing a predetermined amount of $CO_2$ shows superior electric characteristics as a gate insulation film.

The silicon oxide film according to the present invention in particular includes $CO_2$ in the film, wherein, when an integrated intensity of a peak is expressed by (peak width at half height)×(peak height) in an infrared absorption spectrum, the integrated intensity of a $CO_2$-attributed peak which appears in the vicinity of a wave number of 2,340 $cm^{-1}$, is 8E-4 times or more with respect to the integrated intensity of an $SiO_2$-attributed peak which appears in the vicinity of a wave number of 1,060 $cm^{-1}$.

A production method according to the present invention can produce a gate insulation film having superior electric characteristics and suppress the variation of the electric characteristics of a TFT due to an electric stress. Accordingly, the present invention can provide a semiconductor device, an active-matrix substrate and an electronic equipment having high reliability respectively.

DETAILED DESCRIPTION OF THE PREFERRED EMBODIMENT(S)

Advantages of the Invention

A silicon oxide film according to the present invention includes $CO_2$ in the film, wherein, when an integrated intensity of a peak is expressed by (peak width at half height)× (peak height) in an infrared absorption spectrum, the integrated intensity of a $CO_2$-attributed peak which appears in the vicinity of a wave number of 2,340 cm$^{-1}$ is 8E-4 times or more with respect to the integrated intensity of a $SiO_2$-attributed peak which appears in the vicinity of a wave number of 1,060 cm$^{-1}$.

[Operation]

A silicon oxide film is generally used as a material of a gate insulation film. Then, when an organosilane such as tetraethoxy silane (TEOS) is employed for forming a gate insulation film in a TFT, the gate insulation film inevitably contains an intermediate product containing carbon (hereinafter abbreviated to carbon-containing product), which has been left in the gate insulation film due to an insufficient decomposition of the organosilane. In addition, when the gate insulation film is formed with a chemical vapor deposition technique such as a plasma-CVD technique and a low pressure CVD technique, the gate insulation film inevitably contains a relatively significant amount of $H_2O$. When a great amount of the carbon-containing product and $H_2O$ exists in the gate insulation film, the electric characteristics of the gate insulation film deteriorates as described above, and as a result, an operation reliability of the TFT also deteriorates.

Thus, the present inventors made an extensive investigation, and found that the electric characteristics as the gate insulation film can be improved by making the silicon oxide film contain $CO_2$. Accordingly, the above described problems can be solved by applying the gate insulation film to the TFT, and the operation reliability of the TFT can be improved thereby.

At the present time, a reason has not yet been fully clarified why the electric characteristics of the gate insulation film are improved when the silicon oxide film contains $CO_2$, but is presumed as follows. Generally, a porous part existing in the gate insulation film made of the silicon oxide film tends to take $H_2O$, a carbon-containing product or the like therein, which is produced when the gate insulation film is formed. As described above, when $H_2O$ or the carbon-containing product exists in the gate insulation film, the electric characteristics of the gate insulation film inevitably deteriorate. Accordingly, it is considered that the content of $H_2O$ and the carbon-containing product in the gate insulation film can be reduced by forming the gate insulation film so that $CO_2$ instead of $H_2O$ and the carbon-containing product enters into the above described porous part, and consequently the electric characteristics of the gate insulation film can be improved. Then, because $CO_2$ is a stable compound, the gate insulation film containing $CO_2$ acquires immunity of hot-carriers which are formed when the TFT operates, and can reduce the variation of the electric characteristics of the TFT.

The $CO_2$ needs to be uniformly contained in the whole gate insulation film. When there is a part containing little $CO_2$ even partially, it is difficult to suppress the deterioration of the electric characteristics of the gate insulation film.

Figure 2:
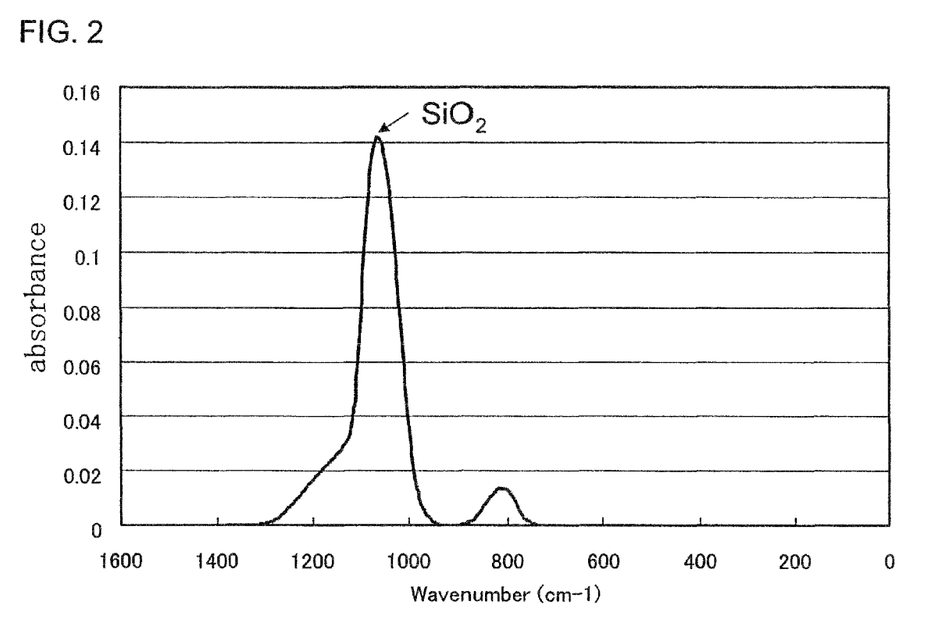
FIG. 2 is an example of an infrared absorption spectrum (wave number=0 to 1,600 $cm^{-1}$) for a gate insulation film according to the present invention.
Figure 3:
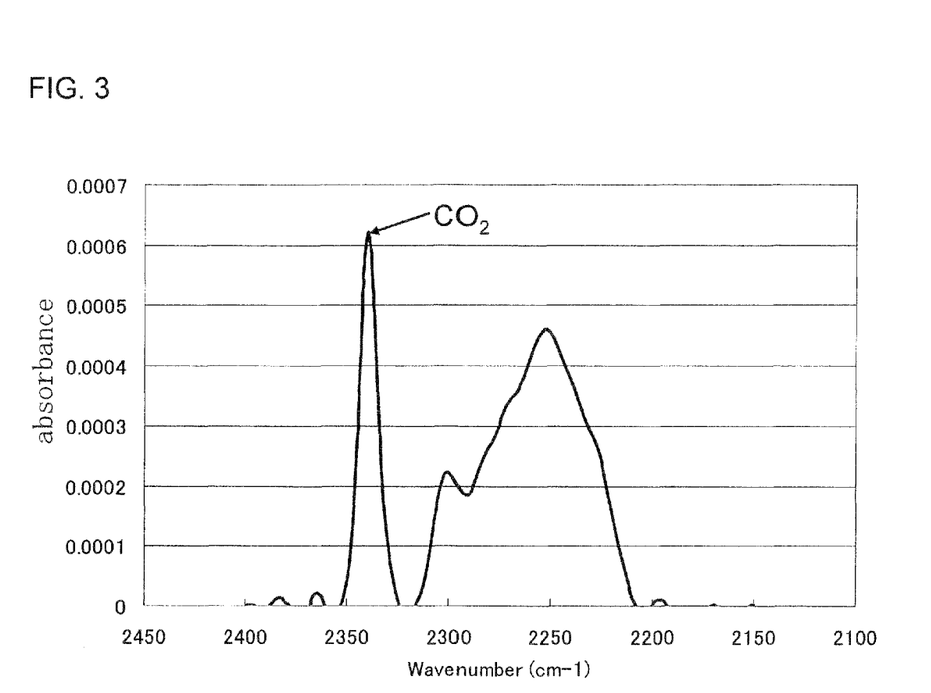
FIG. 3 is an example of an infrared absorption spectrum (wave number=2,100 to 2,450 $cm^{-1}$) for a gate insulation film according to the present invention.

A large peak attributed to $SiO_2$ is naturally observed in the vicinity of the wave number of 1,060 cm$^{-1}$, in an infrared absorption spectrum of the silicon oxide film, as is illustrated in FIG. 2. In addition, when $CO_2$ is contained in the silicon oxide film, a peak attributed to $CO_2$ is observed in the vicinity of the wave number of 2,340 cm$^{-1}$ in the infrared absorption spectrum, as is illustrated in FIG. 3. As is shown in a result which will be described below, when the peak integrated intensity of a $CO_2$-attributed peak appearing in the vicinity of the wave number of 2,340 cm$^{-1}$ (hereinafter abbreviated to $CO_2$-attributed peak) is 8E-4 times or more with respect to the integrated intensity of a $SiO_2$-attributed peak appearing in the vicinity of the wave number of 1,060 cm$^{-1}$ (hereinafter abbreviated to $SiO_2$-attributed peak), the gate insulation film is considered to contain such a quantity of $CO_2$ as to be capable of decreasing the variation of the electric characteristics of the gate insulation film, even when voltage has been applied to the gate electrode of the TFT for many hours. Hereinafter, the integrated intensity of the $CO_2$-attributed peak is abbreviated to $CO_2$-peak integrated intensity, and the integrated intensity of the $SiO_2$-attributed peak is abbreviated to $SiO_2$-peak integrated intensity.

Figure 4:
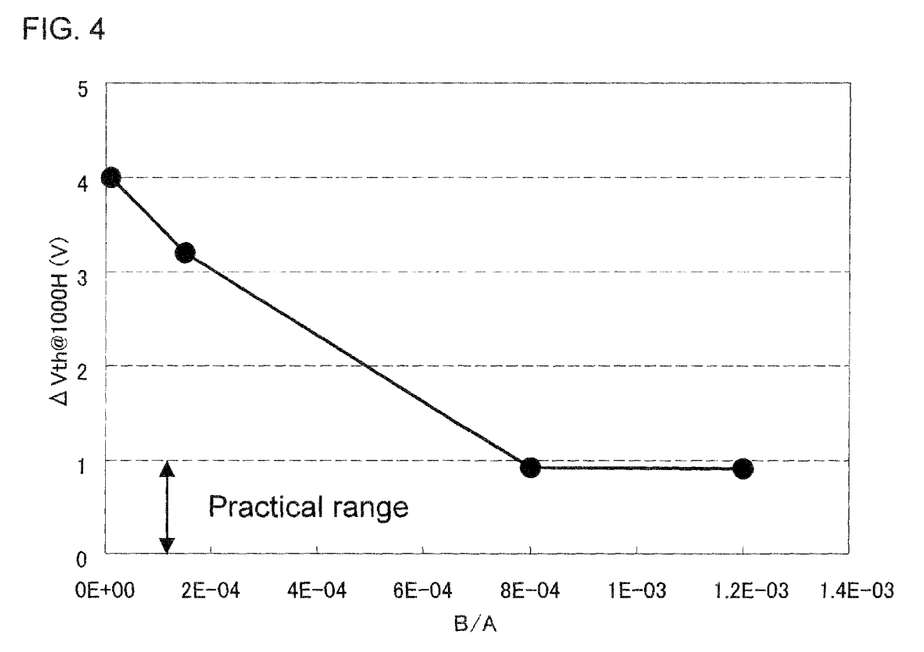
FIG. 4 is a view illustrating a relationship between a variation value of a threshold value when a negative gate stress has been applied to a TFT in the present exemplary embodiment while the TFT has been exposed to a high temperature and high humidity environment, and a ratio (B/A) of $CO_2$-peak integrated intensity (B) to $SiO_2$-peak integrated intensity (A) of a gate insulation film.

Here, a result which present inventors have discussed in detail will now be shown in FIG. 4. FIG. 4 illustrates a relationship between a ratio (B/A) of $CO_2$-peak integrated intensity (B) to $SiO_2$-peak integrated intensity (A) in a gate insulation film and a variation value of a threshold value ($\Delta V_{th}$) in a p channel TFT with the use of the gate insulation film. Here, the variation value of the threshold value was obtained by measuring the variation value of the threshold value when a negative gate-voltage stress ($V_{ds}=0V$ and $V_{gs}=-13V$) has been applied to the p-channel TFT with the use of the gate insulation film, in a high temperature and high humidity environment (temperature of 70° C. and humidity of 85%) for 1,500 hours.

The testing condition, specifically an environment at the temperature of 70° C. and the humidity of 85% may not match an actual working condition, but serves as an accelerating test in the high temperature and high humidity environment. In other words, a method of measuring a deteriorated state of a semiconductor device in the above described testing condition is an effective method for estimating the operation life of an objective semiconductor device.

From FIG. 4, it is understood that when B/A is 8E-4 or more, the variation value of the threshold value of the TFT due to an electric field stress is controlled to 1 V or less, and a sufficiently practical p-channel type TFT can be obtained. On the other hand, when B/A is less than 8E-4, the variation value of the threshold value is 1 V or more, and the sufficiently practical p-channel type TFT cannot be obtained.

In the present exemplary embodiment, an example of a p-channel type TFT was shown. But, an n-channel type TFT can also acquire a similar effect.

Furthermore, it was found from a result which would be described below that when the gate insulation film contained 9E20 molecule/cc or less of $H_2O$ molecules, the gate insulation film not only reduced the variation in the electric characteristics of the TFT but also reduced the dispersion of the electric characteristics of the TFT due to $H_2O$, for instance, the dispersion of $V_{th}$ among substrates, even when voltage has been applied to the gate electrode of the TFT for many hours.

The semiconductor device which uses the silicon oxide film according to the present invention for the gate insulation film has high operation reliability, so that an active-matrix substrate provided with the semiconductor device also results in acquiring the high operation reliability. Furthermore, an electronic device having the high operation reliability can be obtained by applying a liquid-crystal display panel which utilizes the active-matrix substrate to a mobile telephone, a personal computer or the like.

Figure 8:
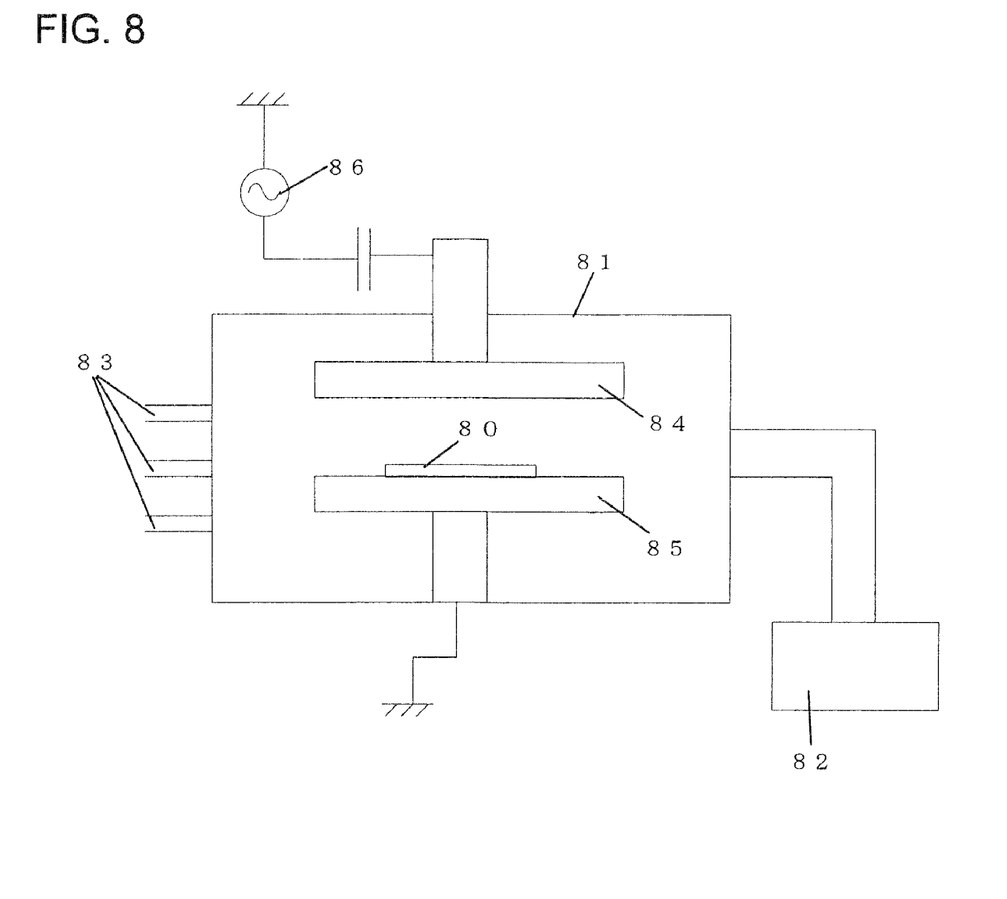
FIG. 8 is a conceptual view illustrating the representative plasma CVD apparatus.

Here, before the present invention will be described in detail, a brief outline of a plasma CVD apparatus will now be explained. FIG. 8 illustrates a conceptual view of the representative plasma CVD apparatus. In FIG. 8, a gas in a chamber 81 is exhausted by a pump 82, and reactant gases are introduced into the chamber 81 from quartz nozzles 83 respectively. Tabular electrodes 84 and 85 are installed in parallel to each other in the inner part of the chamber 81. A high-frequency power source 86 is connected to the electrode 84 through a matching box. The electrode 85 is grounded. A substrate 80 is mounted on the electrode 85. After the substrate 80 has been carried into the vacuum chamber 81, the substrate 80 is mounted on the electrode 85 and is electrically discharged between itself and the electrode 84 by an RF electric power of 13.56 MHz, which has been introduced to the electrode 84. An interlayer insulation film for multilayer wiring is formed by using TEOS, $O_2$ and $NF_3$ gases, for instance, as a source gas. At this time, TEOS, $O_2$ and $NF_3$ gases are introduced into the chamber at 50 sccm, 500 sccm and 0 to 50 sccm respectively, the pressure is set at 5 Torr, for instance, and a silicon oxide film is formed.

An exemplary embodiment according to the present invention will now be described in detail below.

First Exemplary Embodiment

In a first exemplary embodiment of the present invention, a semiconductor device with the use of a silicon oxide film according to the present invention for a gate insulation film and a production method therefor will be described in detail with reference to the drawings. A method for producing a silicon oxide film according to the present invention will also be described in detail.

Figure 1:
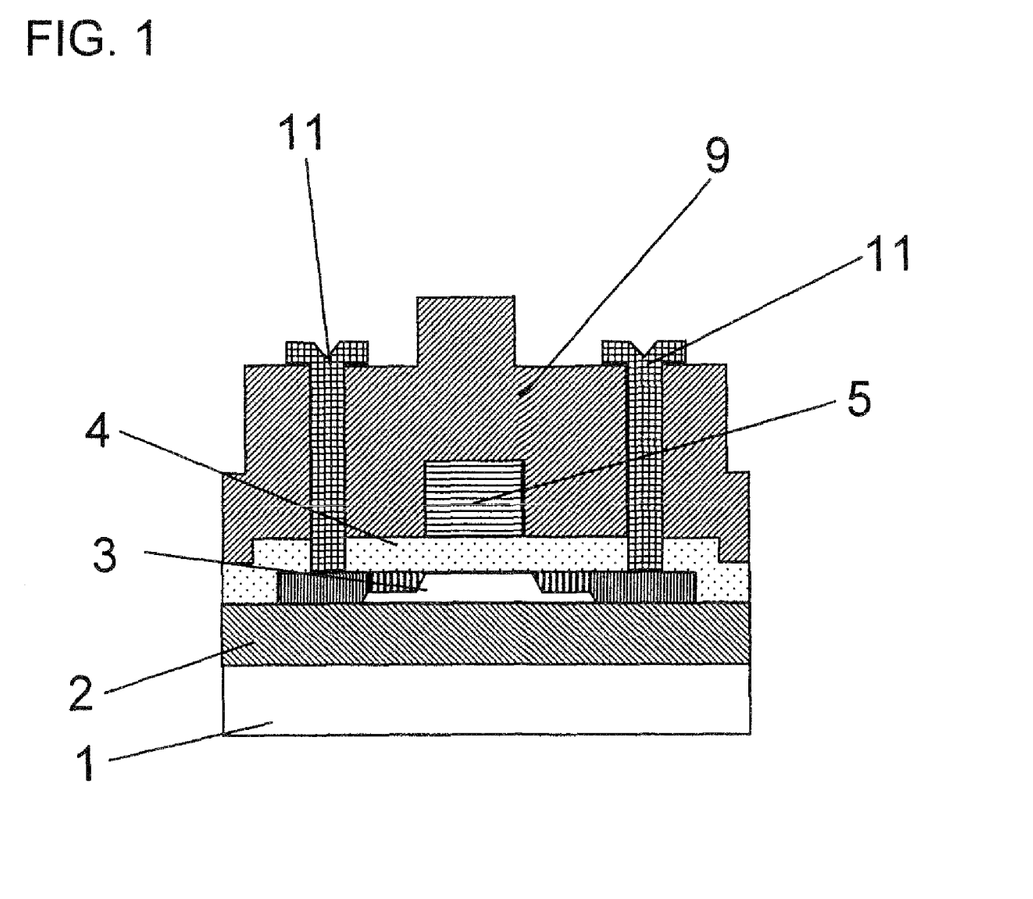
FIG. 1 is a sectional view illustrating a first exemplary embodiment of a semiconductor device according to the present invention.

FIG. 1 is a sectional view showing a semiconductor device in a first exemplary embodiment according to the present invention. A semiconductor device according to the present invention employs the silicon oxide film according to the present invention as the gate insulation film, which is specifically the silicon oxide film containing $CO_2$ so that $CO_2$-peak integrated intensity is 8E-4 times or more with respect to $SiO_2$-peak integrated intensity.

Next, a method for producing a TFT will be described which employs the silicon oxide film according to the present invention as the gate insulation film. FIG. 5 is a view showing each step of producing the TFT in the first exemplary embodiment according to the present invention.

Figure 5A:
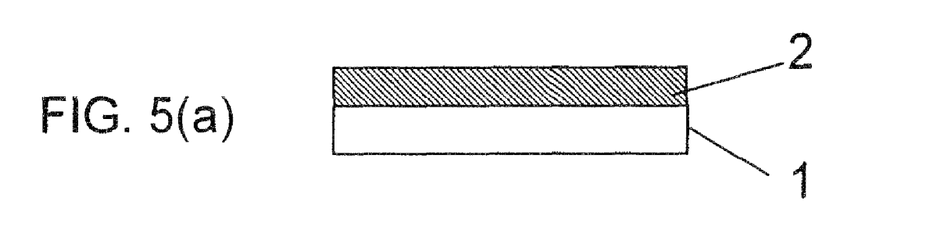
FIG. 5 is a process view showing a method of producing a semiconductor device of a first exemplary embodiment according to the present invention.

(a) At first, the silicon oxide film or a stacked film of a silicon nitride film and the silicon oxide film is formed on an insulative substrate 1 made from glass or the like, as an underlayer 2.

Figure 5B:
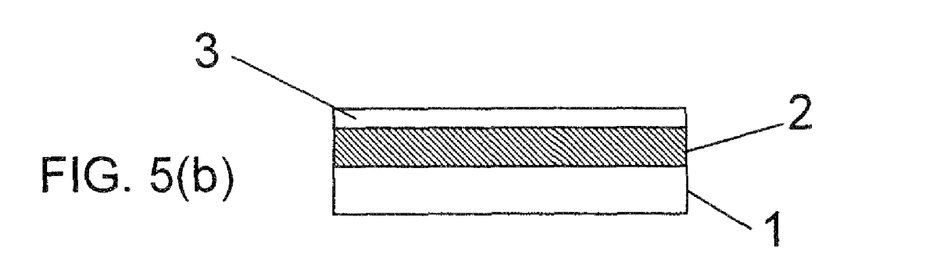

(b) An amorphous silicon film is formed on the underlayer 2. At this time, for the purpose of controlling a threshold value, a very small amount of (for instance, concentration of approximately 1E16 $cm^{-3}$) impurity such as boron and phosphor can be added to the amorphous silicon film while the film is formed. Alternatively, the impurity may be introduced into the film by using an ion-doping technique or an ion implantation technique after the film has been formed. Then, the amorphous silicon film is irradiated with an excimer laser to form a polycrystalline silicon film 3 with superior characteristics.

Next, the polycrystalline silicon film 3 is patterned into a desired shape with the use of a lithographic technique and a dry etching technique, and is cleaned with the use of a diluted hydrofluoric acid (DHF) for the purpose of removing a natural oxide film formed on the surface of the polycrystalline silicon film 3 and making the clean Si face appear, before a gate insulation film 4 will be formed.

Figure 5C:
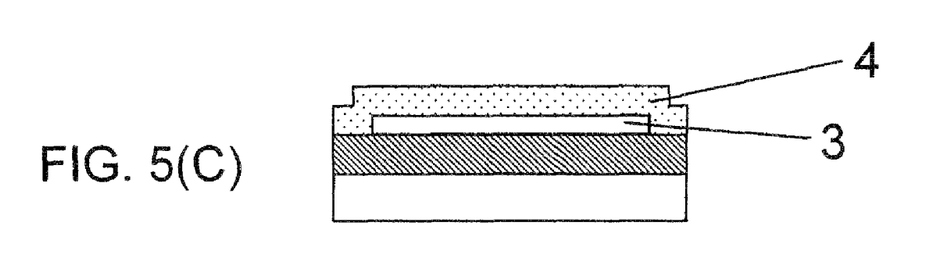

(c) After the cleaning step, the cleaned substrate is transported to a plasma CVD apparatus in order to form the gate insulation film 4 thereon. When the cleaned substrate is transported, boron naturally deposits on the surface of the polycrystalline silicon film 3. This is because a filter to be used for controlling an atmosphere in a clean room often contains a glass fiber and a very small amount of boron existing in the glass fiber floats in the clean room. For this reason, a period of time until the cleaned substrate is transported into the plasma CVD apparatus is preferably 6 hours or shorter, in order to reduce the amount of boron which deposits on the surface of the polycrystalline silicon film 3. If it would take time to transport the cleaned substrate, a large quantity of boron deposits on the polycrystalline silicon film, and the boron having deposited on the polycrystalline silicon film naturally diffuses into the gate insulation film due to a heat applied while a TFT is formed. The diffused boron may react with carbon to be converted into boron carbide due to the heat applied while the TFT is formed, and consume carbon, so that it becomes difficult to control $CO_2$ into a predetermined range.

The gate insulation film 4 can be formed by forming a silicon oxide film with the use of a plasma-CVD technique. Then, the silicon oxide film is preferably formed at 600° C. or lower, which is a lower temperature than that at which the used insulative substrate is greatly deformed. At this time, a mixture gas containing an organosilane represented by TEOS and oxygen can be used as a material gas to be used for forming the gate insulation film.

When forming the gate insulation film 4, the plasma CVD apparatus can promote the decomposition of the organosilane such as TEOS by controlling its RF power density. Furthermore, the plasma CVD apparatus can sufficiently supply oxygen necessary for the reaction of the organosilane to the reaction chamber by controlling a flow ratio of the organosilane to oxygen gas while forming the gate insulation film, and can oxidize a carbon component in the organosilane into $CO_2$.

Accordingly, in order to make the gate insulation film contain a sufficient amount of $CO_2$, it is preferable to set conditions in the plasma CVD technique for forming the gate insulation film at those which will be described below.

The RF power density is preferably set at a range of 0.600 to 1.553 $W/cm^2$. The above described RF power density means a value of the RF power which is applied to a unit area of a stage on which the substrate to be film-formed is placed.

A ratio (F0/F1) of a flow rate (F0) of the oxygen gas to a flow rate (F1) of the organosilane is preferably set at a range of 50 to 500.

When the gate insulation film is formed in the conditions, the organosilane such as TEOS can be sufficiently decomposed, and the content of $CO_2$ in the formed gate insulation film is easily controlled to a predetermined range. In order to make the gate insulation film contain a predetermined quantity of $CO_2$, it is preferable not only to adjust the values of the RF power density and F0/F1, but also to take care so as not to make boron contaminate the gate insulation film.

A thickness of the gate insulation film is not particularly limited, but is preferably set at a range of 5 nm to 5,000 nm, and more preferably at a range of 10 nm to 1,000 nm, for instance.

Furthermore, when the gate insulation film 4 is formed, the whole gate insulation film is preferably formed in the same forming condition as at a time as possible. When the gate insulation film is formed in two or more divided steps having different forming conditions, the gate insulation film of uniform quality is not obtained, so that the TFT having a little variation of electric characteristics may not be obtained. Furthermore, the distribution of qualities between elements is likely to increase.

Figure 5D:
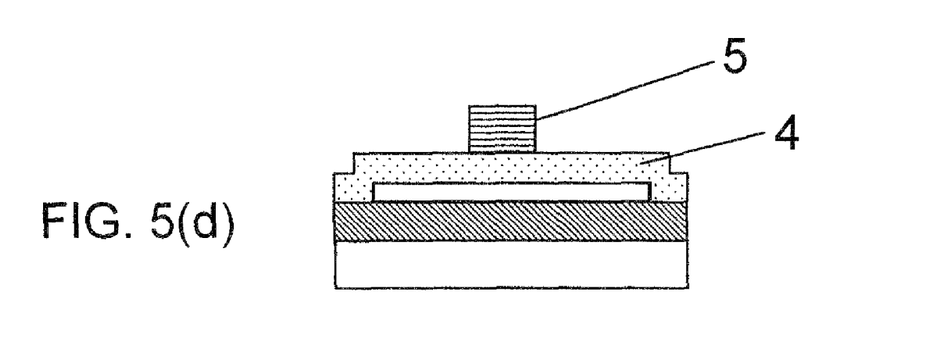

(d) Next, a gate electrode film is formed on the gate insulation film 4. A metal film formed with a sputtering technique, a silicon film containing impurities formed with a CVD technique or the like, or a stacked film thereof can be used for the gate electrode film. The above described impurity is boron or phosphor, and various concentrations and types of the impurities can be added into the silicon film in order to control a threshold value. Then, a photoresist pattern is formed on the gate electrode film with the use of lithography, and a gate electrode 5 is formed with the use of a dry etching or wet etching technique or both of the techniques.

Figure 5E:
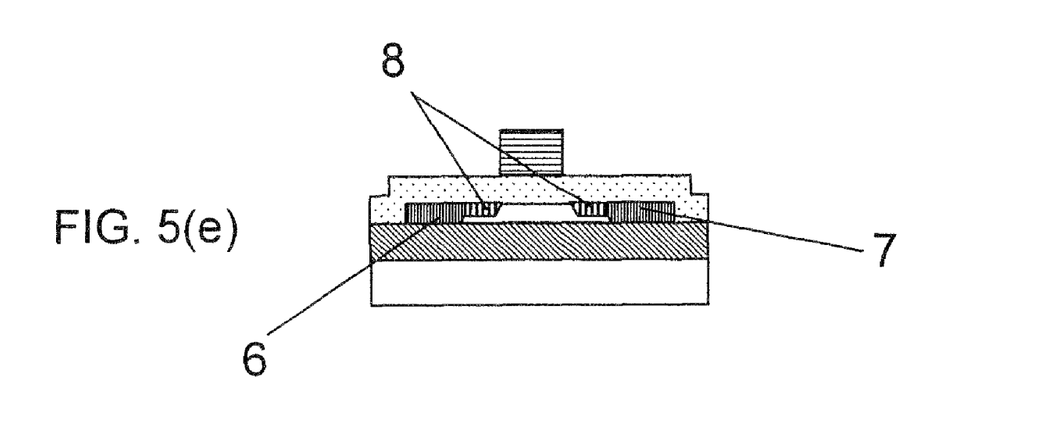

(e) Next, in order to form a source region 6 and a drain region 7, the photoresist pattern is formed thereon, and a high concentration of the impurity is introduced into the regions with the use of an ion-doping technique or an ion implantation technique while using the photoresist pattern as a mask. Boron is used as the impurity when a p-channel type TFT is formed, and phosphor is used as the impurity when an n-channel type TFT is formed. Then, the photoresist pattern is peeled off. Furthermore, in order to form an LDD (Lightly Doped Drain, in other words, low impurity drain) region 8, a lower concentration of the impurity than the impurity introduced so as to form the source region 6 and the drain region 7 is introduced therein while the gate electrode 5 is used as a mask. Boron is used as the impurity when the p-channel type TFT is formed, and phosphor is used as the impurity when the n-channel type TFT is formed. In the present exemplary embodiment, an example in which the source region 6 and the drain region 7 were formed after the gate electrode 5 has been formed was shown, but an example in which the source region 6 and the drain region 7 are formed before the gate electrode 5 is formed shows the same effect. In the present exemplary embodiment, the LDD region 8 is formed, but a source region 6 and a drain region 7 may be formed in a self-aligning way by implanting a high concentration of the impurity therein while the gate electrode 5 is used as a mask, without forming the LDD region 8.

Figure 5F:
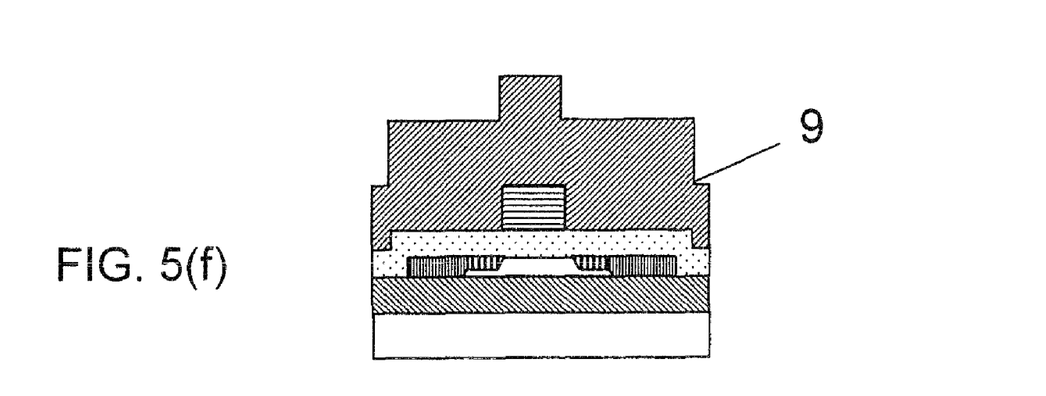

(f) Next, a silicon oxide film, a silicon nitride film or a stacked film thereof is formed with the use of the plasma CVD technique, as an interlayer insulation film 9.

Figure 5G:
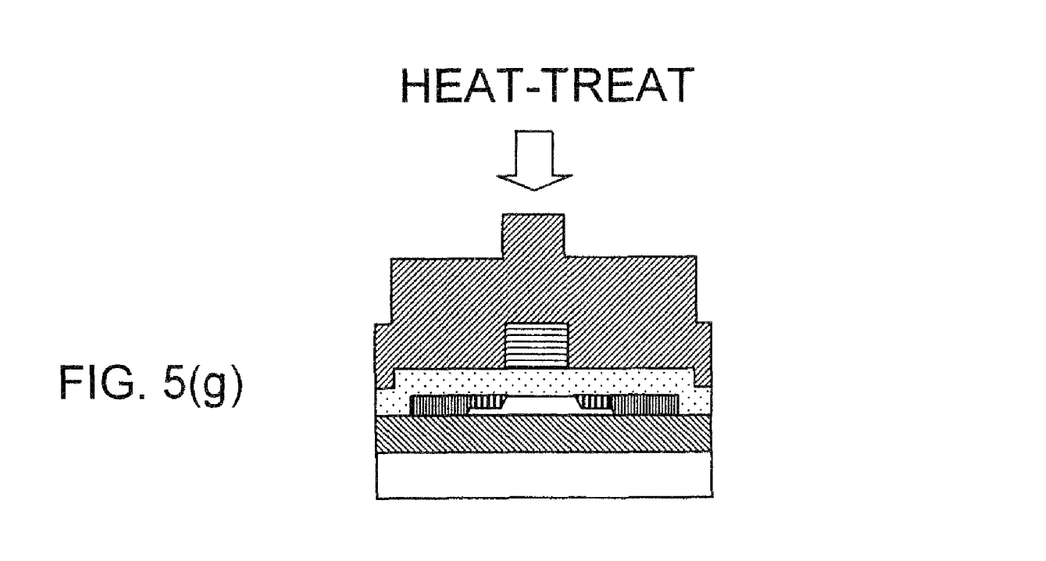

(g) Next, the films are heat-treated at a comparatively-high temperature (for example, 300° C. or higher) in a furnace so as to activate the impurity. In order to activate the impurity, a method of irradiating the films with an excimer laser may be employed.

Figure 5H:
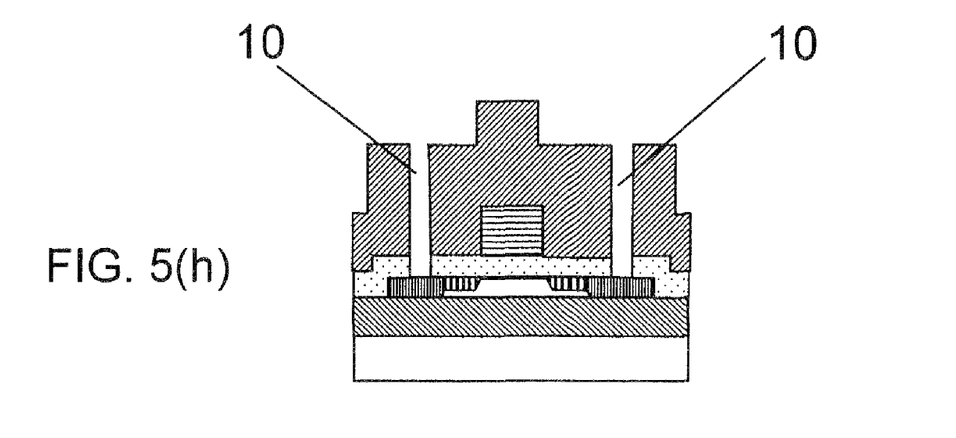

(h) Then, a contact hole 10 (gate electrode 5 is not shown because of being contacted in a different step face) is formed in the interlayer insulation film 9, with the use of a patterning operation of forming a mask pattern with lithography, and dry-etching, wet-etching, or etching the film with both of the processes, so as to reach the source region 6, the drain region 7 and the gate electrode 5.

Figure 5I:
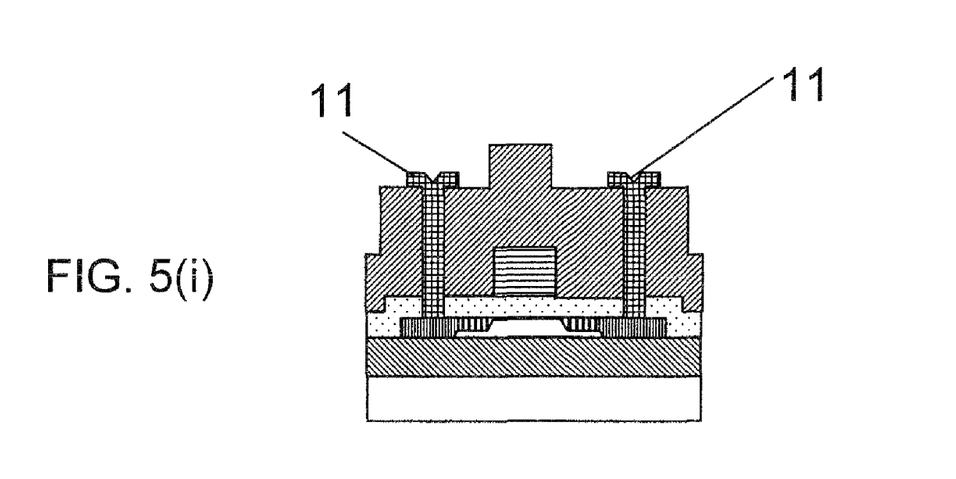

(i) Next, a metal film 11 is formed with the sputtering technique, which is used as an electrode for contacting with the source region 6, the drain region 7 and the gate electrode 5. A TFT can be obtained by forming the metal film 11 into a predetermined electrode shape further through a patterning operation of forming a mask pattern with lithography, and dry-etching, wet-etching or etching the metal film 11 with both of the processes. Optionally, the TFT is subjected to hydrogen plasma treatment so as to terminate a dangling bond which exists in the polycrystalline silicon film 3 or in an interface between the polycrystalline silicon film 3 and the gate insulation film 4 with hydrogen. The hydrogen plasma treatment may be performed prior to the timing.

Afterward, another electrode film, passivation film, interlayer insulation film, flattening film, capacitive insulation film and the like are appropriately formed thereon, according to the application field of the TFT.

Second Exemplary Embodiment

A second exemplary embodiment according to the present invention describes an active-matrix substrate with the use of the semiconductor device which is described in a first exemplary embodiment. Specifically, the active-matrix substrate according to the present invention contains a TFT as a switching element of a pixel electrode, which has been prepared by using a silicon oxide film containing $CO_2$ so that $CO_2$-peak integrated intensity can be 8E-4 times or more with respect to $SiO_2$-peak integrated intensity as a gate insulation film.

Third Exemplary Embodiment

Figure 6:
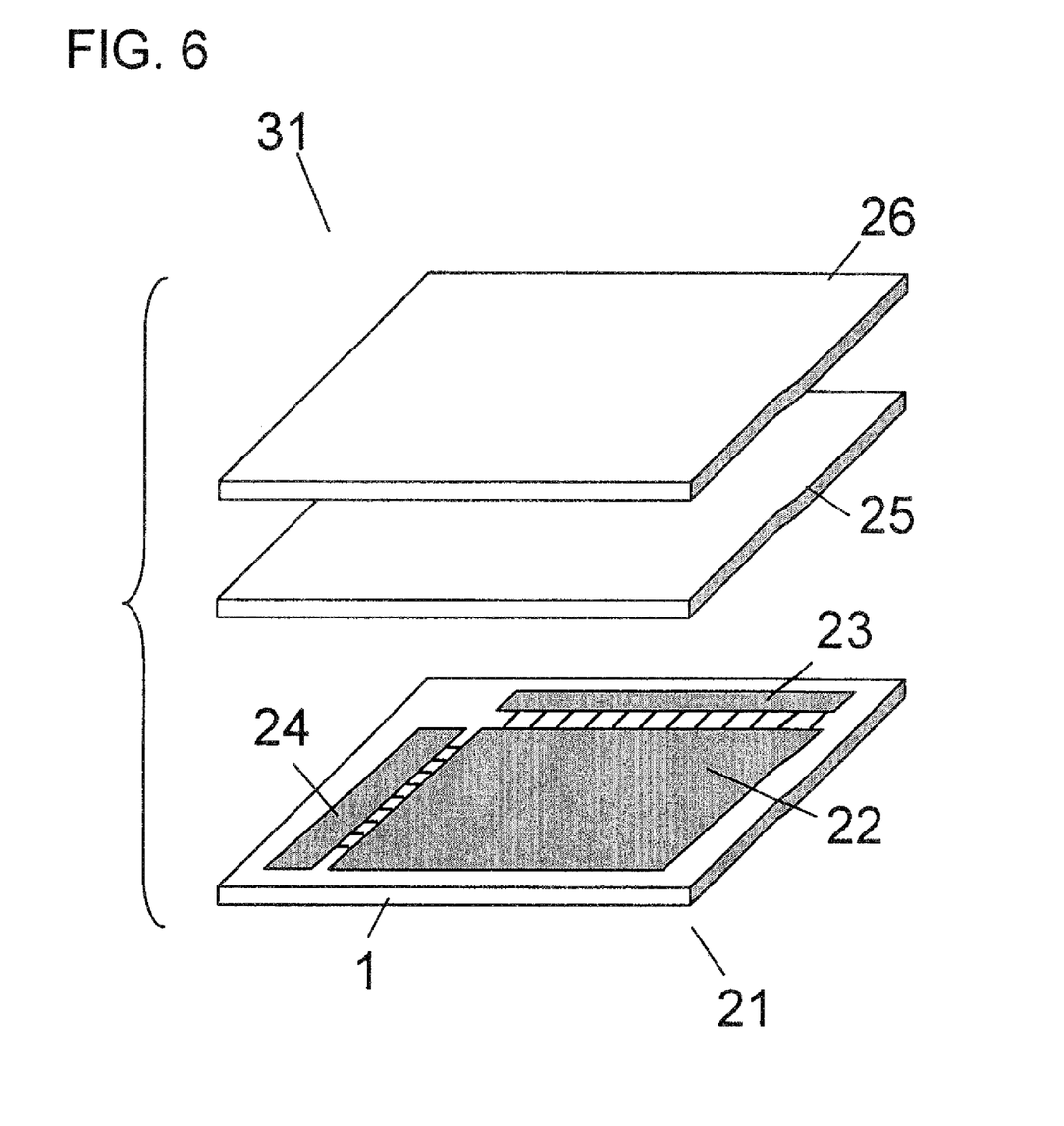
FIG. 6 is an exploded perspective view illustrating a liquid-crystal display panel of a third exemplary embodiment according to the present invention.

Next, a third exemplary embodiment will now be described with reference to the drawing, in which an active-matrix substrate in the second exemplary embodiment is applied to a liquid crystal display. FIG. 6 is an exploded perspective view illustrating a liquid-crystal display panel which uses an active-matrix substrate according to the present exemplary embodiment. As illustrated in FIG. 6, the liquid-crystal display panel 31 according to the present exemplary embodiment has a TFT substrate 21 and an opposite substrate 26 isolated to each other and arranged in parallel to each other. In addition, a liquid crystal layer 25 is provided in between the active-matrix substrate 21 and the opposite substrate 26. The active-matrix substrate 21 has an insulative substrate 1. The insulative substrate 1 has a pixel circuit 22, a data circuit 23 and a scan circuit 24 formed on the surface of the insulative substrate 1 in a facing side to the opposite substrate 26. The active-matrix substrate 21 has a semiconductor device according to the above described first exemplary embodiment mounted thereon.

The liquid-crystal display panel 31 according to the present exemplary embodiment has a semiconductor device (TFT) showing high reliability, and accordingly can be stably operated even after having been used for many hours. Thus, the liquid-crystal display panel 31 has the long life.

Here, the present inventors made a detailed investigation and obtained a result which will be described below.

The life of the liquid-crystal display panels which have employed active-matrix substrates with the use of 5 types of p-channel type TFTs provided with gate insulation films containing different quantities of $CO_2$ and $H_2O$ respectively was examined by determining the display performance of the liquid-crystal display panels after having operated the liquid-crystal display panels in an environment at a high temperature of 70° C. with a high humidity of 85%, for 1,000 hours. The display performance was determined by evaluating the presence of defect, surface irregularity or the like by visual observation. The result is shown in Table 1.

By the way, the testing condition, specifically an environment at temperature of 70° C. and with a humidity of 85%, occasionally does not match an actual working condition, but is a condition of an accelerating test in the high temperature and high humidity environment, as well. Accordingly, it is considered to be an effective method for estimating the operating life of a desired semiconductor device to measure a deteriorated condition in the above described testing condition.

As is shown in Table 1, all liquid-crystal display panels showed a superior display condition before being operated in the high temperature and high humidity environment. The liquid-crystal display panel with the use of the TFT provided with the gate insulation film containing $CO_2$ so that a ratio (B/A) of $CO_2$-peak integrated intensity (B) to $SiO_2$-peak integrated intensity (A) is 8E-4 or more, that is to say, with the use of the TFT according to the present invention, showed an adequate display condition even after having been operated in the high temperature and high humidity environment for 1,000 hours. This is considered to be because the TFT according to the present invention does not change its electric characteristics so much even after having operated for many hours.

In addition, an amount of $H_2O$ existing in the gate insulation film of the liquid-crystal display panel of which the display state has been evaluated as adequate was quantitatively measured with FT-IR, and as a result, was 9E20 molecule/cc or less.

In the present exemplary embodiment, an example of the p-channel type TFT was shown, but an n-channel type TFT also shows a similar effect.

TABLE 1

| | Ratio of integrated intensity of peak (B/A) | $H_2O$ content (molecule/cc) | Evaluation for display state |
|---|---|---|---|
| Liquid-crystal display panel A | 1E-5 | 5E21 | Poor |
| Liquid-crystal display panel B | 2E-5 | 3E21 | Poor |
| Liquid-crystal display panel C | 8E-4 | 9E20 | Good |
| Liquid-crystal display panel D | 8.2E-4 | 8E20 | Good |
| Liquid-crystal display panel E | 4E-3 | 3E20 | Good |

Fourth Exemplary Embodiment

In the next place, a mobile telephone which is a fourth exemplary embodiment of the present invention will be described with reference to the drawings.

Figure 7:
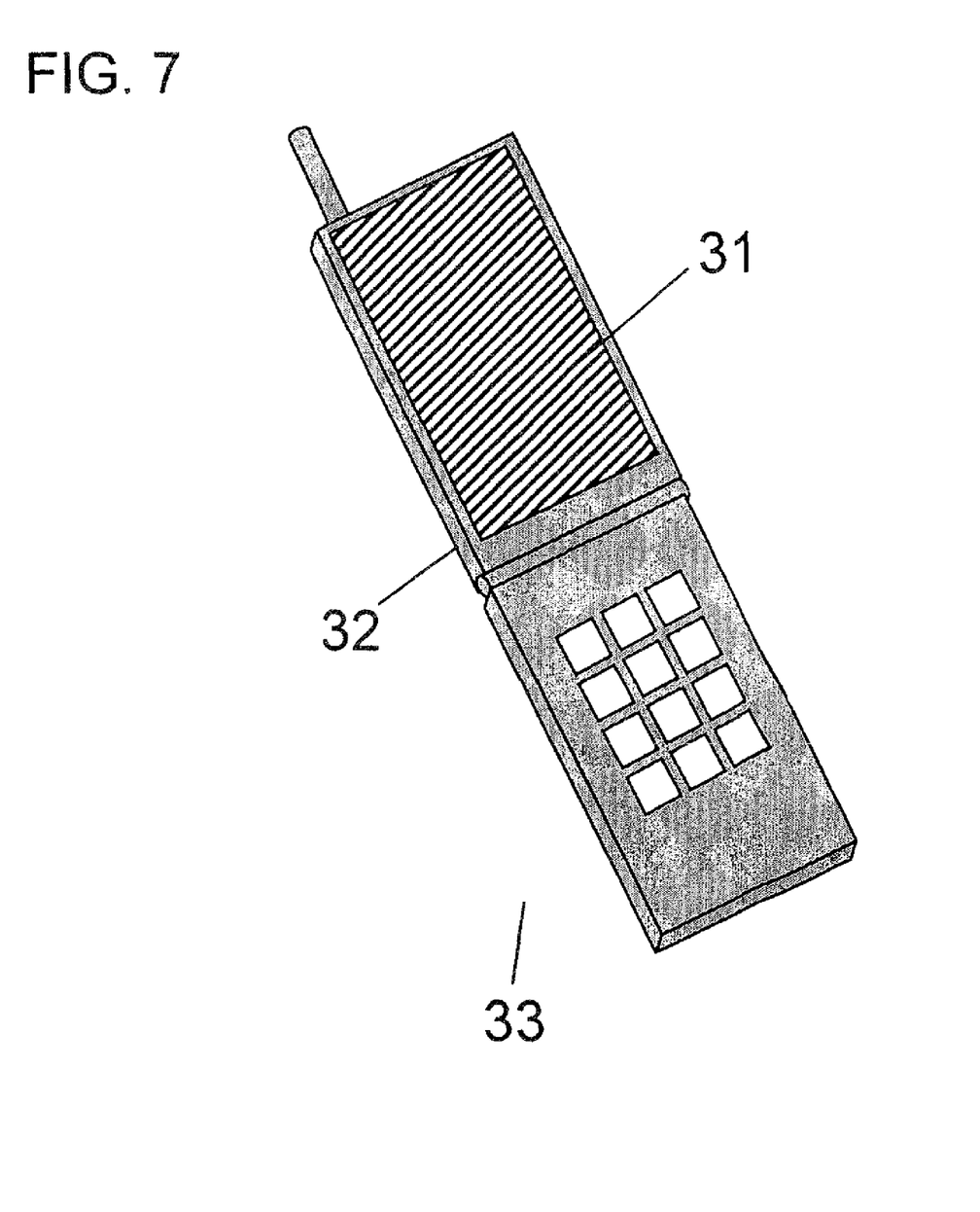
FIG. 7 is a perspective view illustrating an electronic equipment of a fourth exemplary embodiment according to the present invention.

FIG. 7 is a perspective view illustrating an electronic equipment according to the present exemplary embodiment. A mobile telephone 33 has a housing 32 and a liquid-crystal display panel 31 according to the above described third exemplary embodiment installed in the inner part of the housing 32 as a display. The mobile telephone 33 according to the present exemplary embodiment has a TFT with high reliability in the liquid-crystal display panel 31, and accordingly can inhibit a phenomenon in which the liquid-crystal display panel 31 becomes unstable, even after having been used for many hours. Accordingly, the mobile telephone 33 has the long life.

In the present exemplary embodiment, the mobile telephone was exemplified as an electronic equipment. However, the electronic equipment according to the present invention is not limited to the mobile telephone, but may be a personal computer, a PDA (Personal Digital Assistance), a digital (video) camera or the like, for instance.

Fifth Exemplary Embodiment

In the next place, a fifth exemplary embodiment of the present invention will be described. The present exemplary embodiment describes a semiconductor device and a production method therefor according to the above described first exemplary embodiment, more specifically.

At first, a silicon nitride film of 100 nm and a silicon oxide film of 250 nm, for example, are formed in this order on a glass substrate which is an insulative substrate, as an underlayer, with a plasma CVD technique. Furthermore, an amorphous silicon film of 100 nm, for example, is formed thereon with the plasma CVD technique. Moreover, a very small amount of boron or phosphor is implanted into the whole substrate with an ion implantation technique, for the purpose of controlling a threshold value of a TFT.

Subsequently, the amorphous silicon film is subjected to crystallization treatment with the use of an XeCl excimer laser annealing device. A photoresist pattern is formed on the polycrystalline silicon film, and then the polycrystalline silicon film is patterned into an island shape with the use of a dry etching technique.

Next, the patterned polycrystalline silicon film is cleaned with DHF or the like, and a silicon oxide film of 100 nm, for example, is formed with the plasma CVD technique, as a gate insulation film. The gate insulation film is formed in such a condition as to make the gate insulation film contain a predetermined amount of $CO_2$, and is formed so that a ratio (B/A) of $CO_2$-peak integrated intensity (B) to $SiO_2$-peak integrated intensity (A) can be 8E-4 or more in an infrared absorption spectrum. Furthermore, the gate insulation film is preferably formed so as to contain $H_2O$ in an amount of 9E20 molecule/cc or less.

Next, a metal film is formed on the gate insulation film into the thickness of 400 nm, for instance, with the use of a sputtering technique, and a gate electrode is formed with the use of lithography and a dry etching technique, a wet etching technique or techniques thereof.

Next, a high concentration of boron is introduced uniformly onto the whole substrate while the above mentioned gate electrode is used as a mask, and a source region and a drain region are formed in a self-aligning way with the use of an ion-doping device.

Then, a silicon oxide film is formed so as to cover the gate electrode as an interlayer insulation film, with the use of a plasma CVD technique. After having been formed, the silicon oxide film is held, for instance, at the temperature of 400° C. for 3 hours to activate the boron which has been introduced into the source region and the drain region.

Next, a contact hole is formed on a source region, a drain region and a gate electrode, with the use of lithography and a dry etching technique, a wet etching technique or both techniques thereof. Then, a metal film is formed with a sputtering technique, which is used as an electrode for contacting with the source region, the drain region and the gate electrode. A p-channel type TFT having a MOS (Metal-Oxide-Semiconductor) structure (p-channel type MOS TFT) can be obtained further by forming a pattern on the above films with the use of a technique of forming a mask pattern with lithography and a dry-etching technique, a wet-etching technique or both of the techniques, and then by subjecting the films to hydrogen plasma treatment.

The p-channel type MOS TFT which has been formed in the above described exemplary embodiment shows high reliability because the variation of electric characteristics caused by an electric stress was reduced. Furthermore, a semiconductor device, an active-matrix substrate and an electronic device having the p-channel type MOS TFT show high reliability.

Sixth Exemplary Embodiment

In the fifth exemplary embodiment, a method of producing a p-channel type MOS TFT was exemplified. However, a gate insulation film according to the present invention can be applied to a MOS TFT (Complementary MOS TFT, hereinafter abbreviated to a CMOS TFT) which is complementary to a p-channel type and an n-type channel type.

At first, a silicon nitride film of 100 nm and a silicon oxide film of 250 nm, for instance, are formed in this order as an underlayer on a glass substrate which is an insulative substrate, with the use of a plasma CVD technique. Furthermore, an amorphous silicon film of 100 nm, for instance, is formed thereon with the use of a plasma CVD technique. Moreover, after a photoresist pattern has been formed, boron or phosphor is implanted into the amorphous silicon film properly with an ion implantation technique, for the purpose of controlling a threshold value of a TFT.

Next, a photoresist is stripped, and the amorphous silicon film is subjected to crystallization treatment with the use of an XeCl excimer laser annealing device. A photoresist pattern is formed on the polycrystalline silicon film, and then the polycrystalline silicon film is patterned into an island shape with the use of a dry etching technique.

Next, a photoresist pattern is formed on the island-shaped polycrystalline silicon film and the silicon oxide film, and then a high concentration of phosphor is introduced into a source region and a drain region of the n-channel type TFT with the use of an ion-doping device. Furthermore, the photoresist is stripped, another photoresist pattern is formed on the polycrystalline silicon film and the silicon oxide film so as to form the p-channel type TFT, and a high concentration of boron is introduced into the films with the use of the ion-doping device to form a source region and a drain region. Then, the photoresist is stripped by using an $O_2$ plasma ashing technique and dipping the photoresist in a stripping liquid.

Subsequently, the films are cleaned with DHF or the like, and a silicon oxide film with a thickness of 100 nm, for instance, is formed thereon as a gate insulation film with the plasma CVD technique. The gate insulation film is formed in such a condition as to make the gate insulation film contain a predetermined amount of $CO_2$, and is formed so that a ratio (B/A) of $CO_2$-peak integrated intensity (B) to $SiO_2$-peak integrated intensity (A) can be 8E-4 or more in an infrared absorption spectrum. Furthermore, the gate insulation film is preferably formed so as to contain $H_2O$ in an amount of 9E20 molecule/cc or less.

Next, a metal film is formed on the silicon oxide film into the thickness of 400 nm, for instance, with the use of a sputtering technique, and a gate electrode is formed with the use of a patterning operation of forming a mask pattern with lithography and a dry etching technique, a wet etching technique or both of the techniques.

Next, a photoresist pattern is formed so as to cover a region except a region of forming the n-channel type TFT, and an LDD region of the n-channel type TFT is formed in a self-aligning way by implanting a low concentration of phosphor uniformly into the whole substrate with the use of the ion implantation technique while the gate electrode is used as a mask.

Next, a photoresist is stripped, a photoresist pattern is formed so as to cover the region except a region of forming the p-channel type TFT, and an LDD region of the p-channel type TFT is formed in a self-aligning way by implanting a low concentration of boron uniformly into the whole substrate with the use of the ion implantation technique while the gate electrode is used as a mask.

Then, a silicon oxide film is formed so as to cover the gate electrode as an interlayer insulation film, with the use of a plasma CVD technique. After having been formed, the silicon oxide film is held, for instance, at the temperature of 400° C. for 3 hours to activate the boron which has been introduced into the source region and the drain region.

Then, a contact hole is formed in the interlayer insulation film, with the use of a patterning operation of forming a mask pattern with lithography, and dry-etching, wet-etching, or both of the techniques, so that the contact hole reaches the source region, the drain region and the gate electrode. Then, a metal film is formed thereon with a sputtering technique, which is used as an electrode for contacting with the source region, the drain region and the gate electrode. A CMOS TFT can be obtained by patterning the metal film further through a patterning operation of forming a mask pattern with lithography, and a dry etching technique, a wet etching technique, or both of the techniques, and then subjecting the films to hydrogen plasma treatment to terminate a dangling bond in the polycrystalline silicon film with hydrogen.

The CMOS TFT formed in the above mentioned exemplary embodiment shows high reliability because the variation of electric characteristics caused by an electric stress was reduced. Furthermore, a semiconductor device, an active-matrix substrate and an electronic equipment having the CMOS TFT shows high reliability.

EXAMPLE

In the next place, a more specific example according to the present invention will be described, but the present invention is not limited to the example as will be described below.

Example 1

In the present example, a TFT with the use of the gate insulation film prepared under conditions described below was prepared and subjected to an accelerating test, and a variation value of a threshold value ($\Delta V_{th}$) was measured before and after the accelerating test. The TFT was prepared with the use of the above described well-known methods in the process other than a process for forming the gate insulation film.

The gate insulation film in the present example was formed by using a plasma-CVD technique while controlling a ratio (F0/F1) of a flow rate (F0) of oxygen gas to a flow rate (F1) of TEOS to 50 and an RF power density to 0.600 W/cm². In addition, after a polycrystalline silicon film had been cleaned, the substrate was transported to a plasma CVD apparatus within five minutes after the film-forming operation so as to avoid the deposition of boron onto the film as much as possible, and the gate insulation film was formed.

As a result of having measured an infrared absorption spectrum of the gate insulation film in the present example, the ratio (B/A) of $CO_2$-peak integrated intensity (B) to $SiO_2$-peak integrated intensity (A) was 8E-4.

As a result of having applied a negative gate-voltage stress ($V_{ds}$=0V and $V_{gs}$=−13V) to the TFT with the use of the gate insulation film in the present example in a high-temperature and high-humidity environment (temperature of 70° C. and humidity of 85%) for 1,500 hours, and having measured the variation value ($\Delta V_{th}$) of the threshold value before and after the test, the variation value ($\Delta V_{th}$) was 0.92 V. Thereby, the TFT was confirmed to have superior electric characteristics.

Example 2

In the present example, a TFT was prepared under the same condition as in Example 1, except a film-forming condition for the gate insulation film. The gate insulation film in the present example was prepared while controlling a ratio (F0/

F1) of a flow rate (F0) of oxygen gas to a flow rate (F1) of TEOS to 70, and the RF power density to 1.100 W/cm². In addition, after a polycrystalline silicon film had been cleaned, the substrate was transported to a plasma CVD apparatus within five minutes after the film-forming operation so as to avoid the deposition of boron onto the film as much as possible, and the gate insulation film was formed.

As a result of having measured an infrared absorption spectrum of the gate insulation film in the present example, the ratio (B/A) of $CO_2$-peak integrated intensity (B) to $SiO_2$-peak integrated intensity (A) was 1.2E-3.

As a result of having measured the variation value ($\Delta V_{th}$) of the threshold value of the TFT with the use of the gate insulation film in the present example in the same way as in Example 1, the variation value ($\Delta V_{th}$) was 0.91 V. Thereby, the TFT was confirmed to have superior electric characteristics.

Comparative Example 1

In the present comparative example, the TFT was prepared in the same condition as in Example 1, except the film-forming condition for the gate insulation film.

The gate insulation film in the present comparative example was prepared while controlling a ratio (F0/F1) of a flow rate (F0) of oxygen gas to a flow rate (F1) of TEOS to 45, and the RF power density to 0.06 W/cm². The substrate was transported to a plasma CVD apparatus after 8 hours after the film-forming step, and the gate insulation film was formed.

As a result of having measured an infrared absorption spectrum of the gate insulation film in the present comparative example, the ratio (B/A) of $CO_2$-peak integrated intensity (B) to $SiO_2$-peak integrated intensity (A) was 1.5E-4.

As a result of having measured the variation value ($\Delta V_{th}$) of the threshold value of the TFT with the use of the gate insulation film in the present comparative example in the same way as in Example 1, the variation value ($\Delta V_{th}$) was 3.2 V which was confirmed not to be a practical value.

Comparative Example 2

In the present comparative example, the TFT was prepared in the same condition as in Example 1, except the film-forming condition for the gate insulation film.

The gate insulation film in the present comparative example was prepared while controlling a ratio (F0/F1) of a flow rate (F0) of oxygen gas to a flow rate (F1) of TEOS to 30, and the RF power density to 0.06 W/cm². The substrate was transported to the plasma CVD apparatus after 8 hours after the film-forming step, and the gate insulation film was formed.

As a result of having measured an infrared absorption spectrum of the gate insulation film in the present comparative example, the ratio (B/A) of $CO_2$-peak integrated intensity (B) to $SiO_2$-peak integrated intensity (A) was 1.0E-5.

As a result of having measured the variation value ($\Delta V_{th}$) of the threshold value of the TFT with the use of the gate insulation film in the present comparative example in the same way as in Example 1, the variation value ($\Delta V_{th}$) was 4.0 V which was confirmed not to be a practical value.

This patent application insists on priority based on Japanese Patent Application No. 2007-147405 filed on Jun. 1, 2007, and all of the disclosure are herein incorporated.

In the above, the present invention was described with reference to exemplary embodiments and examples, but the present invention is not limited to the exemplary embodiments and examples. The constitution and details of the present invention can be subjected to various modifications that those skilled in the art can understand, in the scope of the present invention.

What is claimed is:

1. A semiconductor device comprising a silicon oxide film as a gate insulation film, wherein $CO_2$ is uniformly contained in the silicon oxide film, and wherein, when an integrated intensity of a peak is expressed by (peak width at half height)×(peak height) in an infrared absorption spectrum, the integrated intensity of a $CO_2$-attributed peak which appears in the vicinity of a wave number of 2,340 cm$^{-1}$ is 8E-4 times or more with respect to the integrated intensity of an $SiO_2$-attributed peak which appears in the vicinity of a wave number of 1,060 cm$^{-1}$.

2. The semiconductor device according to claim 1, wherein the $CO_2$-attributed peak and the $SiO_2$-attributed peak are derived from the $CO_2$ and $SiO_2$ in the silicon oxide film.

3. The semiconductor device according to claim 1, wherein an amount of $H_2O$ existing in the silicon oxide film is 9E20 molecule/cc or less.

4. The semiconductor device according to claim 1, wherein the silicon oxide film is deposited between a gate electrode and a silicon film so that the silicon oxide film is in direct contact with both the gate electrode and the silicon film.

5. The semiconductor device according to claim 4, wherein the silicon film is a polycrystalline silicon film.

6. The semiconductor device according to claim 5, wherein the polycrystalline silicon film is formed on an insulative substrate, and the semiconductor device is a thin film transistor which uses the polycrystalline silicon film as a channel layer.

7. The semiconductor device according to claim 6, wherein an underlayer is formed between the polycrystalline silicon film and the insulative substrate.

8. An active-matrix substrate including the semiconductor device according to claim 1.

9. An electronic equipment including the active-matrix substrate according to claim 8.

10. A method for producing the semiconductor device according to claim 1, which comprises forming the silicon oxide film by using a plasma CVD apparatus, wherein a ratio (F0/F1) of a flow rate (F0) of oxygen gas to a flow rate (F1) of an organosilane is controlled to 50 or more, and a RF power density is set at a range of 0.600 to 1.553 W/cm², and a period of time between finishing a cleaning step and transporting into the plasma CVD apparatus is 6 hours or shorter.

11. A semiconductor device comprising a silicon oxide film as a gate insulation film, wherein $CO_2$ is uniformly contained in the silicon oxide film, and wherein, when an integrated intensity of a peak is expressed by (peak width at half height)×(peak height) in an infrared absorption spectrum, the integrated intensity of a $CO_2$-attributed peak which appears in the vicinity of a wave number of 2,340 cm$^{-1}$ is 8E-4 times or more to 4E-3 times the integrated intensity of an $SiO_2$-attributed peak which appears in the vicinity of a wave number of 1,060 cm$^{-1}$.

12. The semiconductor device according to claim 11, wherein the $CO_2$-attributed peak and the $SiO_2$-attributed peak are derived from the $CO_2$ and $SiO_2$ in the silicon oxide film.

13. The semiconductor device according to claim 11, wherein an amount of $H_2O$ existing in the silicon oxide film is 9E20 molecule/cc or less.

14. The semiconductor device according to claim 11, wherein the silicon oxide film is deposited between a gate electrode and a silicon film so that the silicon oxide film is in direct contact with both the gate electrode and the silicon film.

15. The semiconductor device according to claim 14, wherein the silicon film is a polycrystalline silicon film.

16. The semiconductor device according to claim 15, wherein the polycrystalline silicon film is formed on an insulative substrate, and the semiconductor device is a thin film transistor which uses the polycrystalline silicon film as a channel layer.

17. The semiconductor device according to claim 16, wherein an underlayer is formed between the polycrystalline silicon film and the insulative substrate.

18. An active-matrix substrate including the semiconductor device according to claim 11.

19. An electronic equipment including the active-matrix substrate according to claim 18.

20. A method for producing the semiconductor device according to claim 11, which comprises forming the silicon oxide film by using a plasma CVD apparatus, wherein a ratio (F0/F1) of a flow rate (F0) of oxygen gas to a flow rate (F1) of an organosilane is controlled to 50 or more, and a RF power density is set at a range of 0.600 to 1.553 W/cm$^2$, and a period of time between finishing a cleaning step and transporting into the plasma CVD apparatus is 6 hours or shorter.

* * * * *